US007289558B2

(12) United States Patent
Bose et al.

(10) Patent No.: US 7,289,558 B2
(45) Date of Patent: Oct. 30, 2007

(54) INFINITE IMPULSE RESPONSE MULTIPLIERLESS DIGITAL FILTER ARCHITECTURE

(75) Inventors: Tamal Bose, Logan, UT (US); Alan W. Shaw, Lewiston, UT (US); Chirag RamGopal Sharma, Logan, UT (US); Ratchaneekorn Thamvichai, St. Cloud, MN (US)

(73) Assignee: Utah State University, Logan, UT (US)

( * ) Notice: Subject to any disclaimer, the term of this patent is extended or adjusted under 35 U.S.C. 154(b) by 736 days.

(21) Appl. No.: 10/615,004

(22) Filed: Jul. 8, 2003

(65) Prior Publication Data

US 2005/0008071 A1 Jan. 13, 2005

(51) Int. Cl.
*H03H 7/40* (2006.01)
(52) U.S. Cl. ............... 375/233; 340/825.68; 380/265; 455/307; 708/420
(58) Field of Classification Search ............... 375/147, 375/229, 233; 327/105; 329/304; 381/101; 702/190; 708/300, 315, 319, 627
See application file for complete search history.

(56) References Cited

U.S. PATENT DOCUMENTS

| 4,862,402 | A * | 8/1989 | Shah et al. ............... 708/315 |
|---|---|---|---|
| 2002/0126858 | A1* | 9/2002 | Yeum ............... 381/101 |
| 2002/0131487 | A1* | 9/2002 | Butler et al. ............... 375/229 |
| 2003/0083852 | A1* | 5/2003 | Muhammad et al. ....... 702/190 |

OTHER PUBLICATIONS

Yu et al., "New Natural Selection Process and Chromosome Encoding for the Design of Multiplierless Lattice QMF Using Genetic Algorithm," 2001 IEEE, pp. 1273-1276.

Sriranganathan et al., "Design of 2-D Multiplierless FIR Filters Using Genetic Algorithms," Genetic Algorithms in Engineering System: Innovations and Applications Sep. 12-14, 1995, Conference Publication No. 414, © IEE, 1995, pp. 282-286.

Bhattacharya et al., "Multiplierless Implementation of Recursive Digital Filters Using a Class of Low Sensitivity Structures," International Symposium on Signal Processing and its Applications (ISSPA), Kuala Lumpur, Malaysia, Aug. 13-16, 2001, Organized by the Dept. of Microelectronics and Computer Engineering, UTM, Malaysia and Signal Processing Research Centre, QUT, Australia, 2001 IEEE, pp. 611-614.

Lee et al., "GA-based design of multiplierless 2-D state-space digital filters with low roundoff noise," IEE Proc.-Circuits Devices Syst., vol. 145, No. 2, Apr. 1998, pp. 118-124.

Lee et al., "GA-Based Design of Multiplierless 2-D Digital Filters with Very Low Roundoff Noise," Proceedings of IEEE Asia Pacific Conference on Circuits and Systems '96, Nov. 18-21, 1996, Seoul, Korea, 1996, IEEE, pp. 223-226.

Bhattacharya et al., "Multiplierless Implementation of Bandpass and Bandstop IIR Digital Filters," Institute of Signal Processing, Tampere University of Technology, P. O. Box 553, Tampere, FIN 33101, Finland, 2002 IEEE, pp. III-3184-III-3187.

(Continued)

*Primary Examiner*—David C. Payne
*Assistant Examiner*—Adolf DSouza
(74) *Attorney, Agent, or Firm*—John R. Thompson; Stoel Rives LLP

(57) ABSTRACT

A multiplierless IIR filter incorporates power-of-two coefficients to perform shift operations to reduce space and increase speed. To optimize performance, a genetic algorithm generates the power-of-two coefficients. The filter architecture includes shift registers to receive input samples and previous outputs. A shifter stage is employed to perform shift operations for the input samples and previous outputs based on corresponding power-of-two coefficients. Products are added by parallelism and sequential pipelining to produce an output.

32 Claims, 3 Drawing Sheets

OTHER PUBLICATIONS

Bhattacharya et al., "Multiplierless Implementation of Recursive Digital Filters Based on Coefficient Translation Methods in Low Sensitivity Structures," Tampere International Center for Signal Processing, Tampere University of Technology, P. O. Box 553, Tampere, FIN 33101, Finland, 2001 IEEE, pp. II-697-II-700.

Cemes et al., "Genetic approach to design of multiplierless FIR filters," Electronics Letters, 25th Nov. 1993, vol. 29, No. 24, pp. 2090-2091.

Mao et al., "Design and Multiplierless Implementation of Two-Channel Biorthogonal IIR Filter Banks with Low System Delay," Dept. of Electrical and Computer Engineering, University of Victoria, Victoria, B.C., Canada V8W 3P6, Dept. of Electrical and Electronic Engineering, University of Hong Kong, Pokfulam Road, Hong Kong, 2001 IEEE, pp. II-465-II-468.

Hounsell et al., "Evolutionary Design and Adaptation of Digital Filters Within an Embedded Fault Tolerant Hardware Platform," Department of Electronics and Electrical Engineering, The University of Edinburgh, King's Buildings, Mayfield Rd, Edinburgh EH9 3JL, 2001 IEEE, pp. 127-135.

Oh et al., "Design of Discrete Coefficient FIR and IIR Digital Filters with Prefilter-Equalizer Structure Using Linear Programming," IEEE Transactions on Circuits and Systems—II: Analog and Digital Signal Processing, vol. 47, No. 6, Jun. 2000, pp. 562-565.

Wiatr et al., "Implementation of real time image convolutions in FPGA structures," pp. 1-10.

Wiatr et al., "Constant Coefficient Multiplication in FPGA Structures," AGH Technical University, Institute of Electronics, Mickiewicza 30, 30-059 Kraków, Poland, pp. 1-8.

Venkatachalam et al., "Adaptive Linear Prediction with Power-of-Two Coefficients," Electrical & Computer Engineering, Utah State University, Logan, UT 84322-4120, Electrical & Computer Engineering, University of Colorado, Boulder, CO 80309-0425, 2001, IEEE, pp. 533-537.

Thamvichai et al., "Design of 2-D Multiplierless Filters Using the Genetic Algorithm," Electrical & Computer Engineering, University of Colorado, Boulder, CO 80309, Electrical & Computer Engineering, Utah State University, Logan, UT 84322-4120, 2001 IEEE, pp. 588-591.

Jamro et al., "FPGA Implementation of Addition as a Part of the Convolution," AGH Technical University, Institute of Electronics, Mickiewicza 30, 30-059 Kraków, Poland, pp. 1-9.

Jamro et al., "Convolution Operation Implemented in FPGA Structures for Real-Time Image Processing," AGH Technical University, Institute of Electronics, pp. 1-6.

Ghanekar et al., "Implementation of Recursive Filters Using Highly Quantized Periodically Time-Varying Coefficients," Department of Electrical and Computer Engineering, University of Massachusetts, Amherst, MA 01003, 1991 IEEE, pp. 1625-1628.

Hartnett et al., "IIR Filters with Reduced Multipliers Using Cyclotomic Polynomial Numerators," U. S. Coast Guard Academy, New London, CT 06320, University of Rhode Island, Kingston, RI 02881, 1992 IEEE, pp. IV-321-324.

Milić "Design of Multiplierless Elliptic IIR Filters," Mihajlo Pupin Institute, Volgina 15, 11000 Belgrade, Yugoslavia, IRITEL Institute, Batajnicki put 23, 11080 Belgrade, Yugoslavia, 1997 IEEE, p. 2201-2204.

Lian, "FPGA Implementation of High Speed Multiplierless Frequency Response Masking FIR Filters," Electrical Engineering Department, National University of Singapore, 10 Kent Ridge Crescent, Singapore 119260, 2000 IEEE, pp. 317-325.

Lutovac et al., "Approximate Linear Phase Multiplierless IIR Halfband Filter," IEEE Transactions on Signal Processing Letters, vol. 7, No. 3, Mar. 2000, pp. 52-53.

Chan et al., "Multiplierless Perfect Reconstruction Modulated Filter Banks with Sum-of-Powers-of-Two Coefficients," IEEE Signal Processing Letters, vol. 8, No. 6, Jun. 2001, pp. 163-166.

Milić et al., "Design of Multiplierless Elliptic IIR Filters with a Small Quantization Error," IEEE Transactions on Signal Processing, vol. 47, No. 2, Feb. 1999, p. 469-479.

Thamvichai et al., "Design of 2-D Multiplierless IIR Filters Using the Genetic Algorithm," IEEE Transactions on Circuits and Systems—I: Fundamental Theory and Applications, vol. 49, No. 6, Jun. 2002, pp. 878-882.

* cited by examiner

INFINITE IMPULSE RESPONSE MULTIPLIERLESS DIGITAL FILTER ARCHITECTURE

TECHNICAL FIELD

The present invention relates to digital signal processing, and, more specifically, to IIR digital filter designs avoiding the use of multipliers and implemented in a VLSI architecture.

BACKGROUND OF THE INVENTION

Digital signal processing (DSP) provides tremendous benefits in manipulating analog information, such as audio, still pictures, and video, that have been converted into digital information. DSP improves the accuracy and reliability of digital communications and is used extensively in numerous applications throughout modern society. DSP operates by clarifying and standardizing the level or states of a digital signal. In so doing, a DSP circuit is able to differentiate between human-made signals, which are ordered, and noise, which is inherently chaotic.

Most digital signal processing functions require digital filters. Digital filters are used for many purposes including reducing noise from corrupted signals, transforming signals in the frequency domain, and changing certain characteristics of a signal to a desired characteristic. Specific applications of digital filters include noise and distortion reduction in cellular phones, multipath cancellation in digital television systems, reducing distortion in digital modems, filtering operations in CD players, GPS systems, and target detection and other forms of military hardware. As can be appreciated, numerous other applications exist in the ever-expanding product lines of consumer electronics.

The consumer electronic industry is always seeking improved algorithms for filter designs. Areas of improvement include faster filtering, lower power consumption, and less chip area. Faster filtering improves processing speeds and lower power translates into less expensive operating costs. Reducing the chip area means more functions can be incorporated into the same chip which is the trend of today's consumer electronics. Less chip area also reduces the overall cost of the chip.

Thus, it would be an advancement in the art to provide a filter design with increased speed, lower power, and reduced chip area. Such an invention is disclosed and claimed herein.

SUMMARY OF THE INVENTION

The present invention provides an improved Infinite Impulse Response (IIR) filter with feedback and forward coefficients. For VLSI implementation, multiplierless filters are faster, more compact, and use less power than filters with multipliers. Multiplication of any number with a power-of-two number is a shift operation. Through shift operations, a filtering technique eliminates multipliers and their disadvantages.

To increase filtering performance, power-of-two coefficients of the designed filter are derived using a genetic algorithm. Genetic algorithms are based on a biological metaphor that views the process as a competition among a population of evolving candidate problem solutions. A fitness function evaluates each solution to decide whether it will contribute to the next generation of solutions. Then, through operations analogous to gene transfer in sexual reproduction, the algorithm creates a new population of candidate solutions. The process continues until the solution meets the target value or the genetic algorithm does not yield better results after a certain number of iterations.

The IIR filter design of the present invention includes a memory with the power-of-two coefficients generated by a genetic algorithm stored thereon. The filter further includes two shift registers to receive input samples and previous outputs. A shifter stage is coupled to the memory and the two shift registers to receive the power-of-two coefficients, input samples, and previous outputs. The shifter stage performs shift operations for input samples and previous outputs based on corresponding power-of-two coefficients.

The products generated by the shifter stage are transmitted to an adder stage that adds the products in parallel. The filter architecture incorporates sequential pipelining for computing the output at a very fast rate. The sums are then accumulated to produce an outputted estimate.

The filter architecture provides a smaller, faster, and cheaper digital filter than conventional designs. Additional aspects and advantages of this invention will be apparent from the following detailed description of preferred embodiments, which proceeds with reference to the accompanying drawings.

BRIEF DESCRIPTION OF THE DRAWINGS

Non-exhaustive embodiments of the invention are described with reference to the figures in which.

DETAILED DESCRIPTION OF PREFERRED EMBODIMENTS

Figure 1:
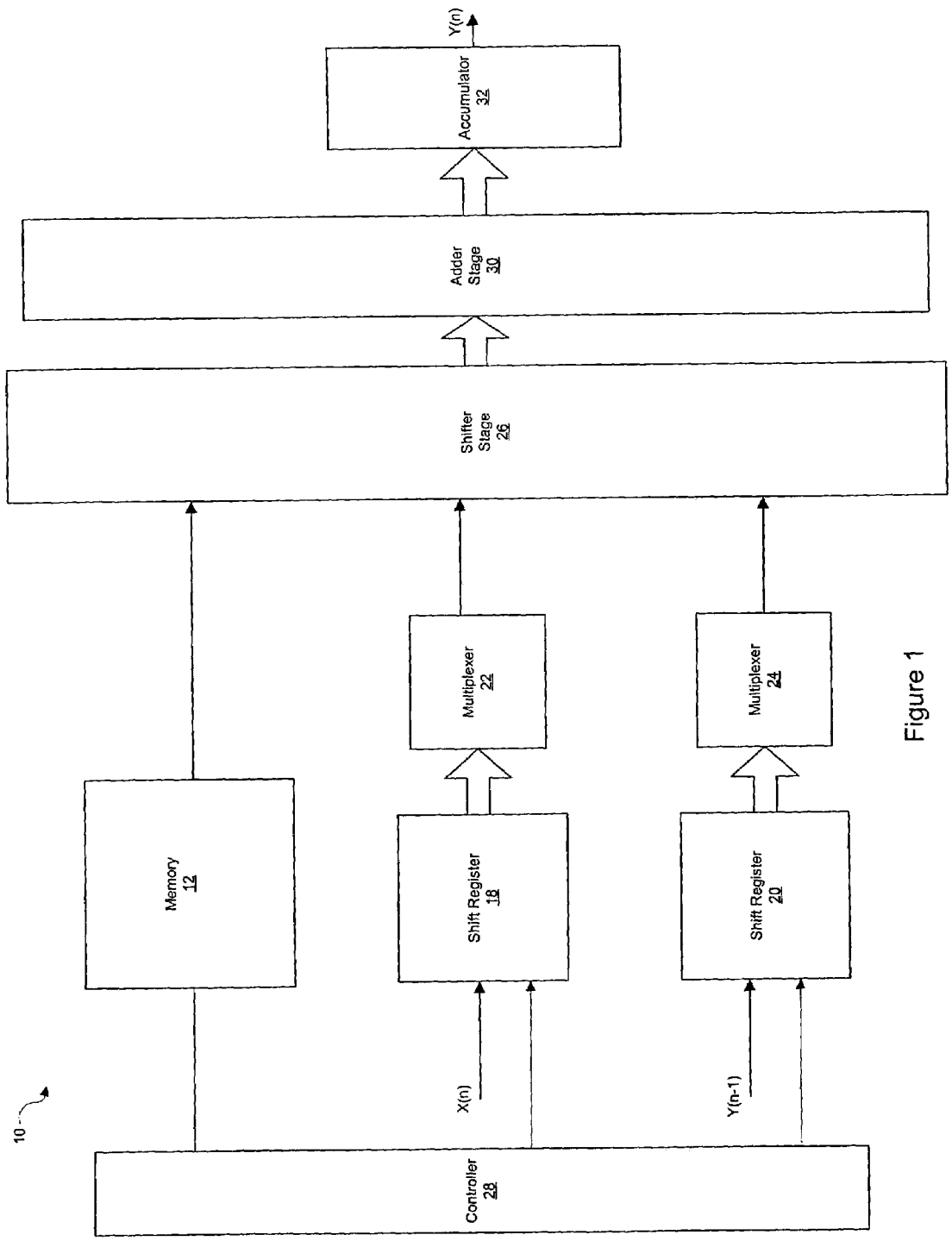
FIG. 1 is a block diagram of a filter design architecture.

Reference is now made to the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

The present invention relies on evolutionary algorithms to provide coefficient values for implementation in the design architecture. The field of evolutionary algorithms includes problem solving systems that involve evolutionary processes as key elements in the design and implementation. A variety of evolutionary algorithms exist with some of the more well known being genetic algorithms, evolutionary programming, evolution strategies, classifier systems, and genetic programming.

All of the evolutionary algorithms share a common concept of simulating the evolution of individual structures via processes of selection, mutation, and reproduction. The processes depend on the perceived performance of the individual structures as defined by an environment.

Evolutionary algorithms maintain a population of structures, that evolve according to rules of selection and other operators, which are referred to as search operators. Each individual in the population receives a measure of its fitness in the environment. Reproduction focuses attention on high fitness individuals to exploit the available fitness information. Recombination and mutation perturb those individuals and provide general heuristics for exploration. The evolutionary algorithms are sufficiently complex to provide robust and powerful adaptive search mechanisms.

The present invention incorporates genetic algorithms to optimize the filter design coefficients. The genetic algorithm is a model of learning that derives its behavior from a metaphor of the processes of evolution in nature. This is done by the creation of a population of individuals represented by chromosomes, in essence a set of character strings. The individuals in the population then experience a process of evolution. The process of evolution requires individuals to compete for resources in an environment. Those individuals that are more successful are more likely to survive and propagate their genetic material.

In practice, the genetic model of computation is implemented in arrays of bits or characters to represent the chromosomes. The genetic algorithm is not a random search for a solution to the problem of selecting the highly fit individual. The genetic algorithm uses a stochastic process, but the result is better than a random process.

Genetic algorithms are used for various applications. One example, would be multidimensional optimization problems in which the character string of the chromosome can be used to encode the value for the different parameters being optimized.

When a genetic algorithm is implemented, it is usually done in a manner that involves the following cycle: evaluate the fitness of all of the individuals in the population; create a new population by performing operations such as fitness-proportionate reproduction on the individuals whose fitness has just been measured; and discard the old population and iterate using the new population.

One iteration of this cycle is referred to as a generation. The first generation of this process operates on a population of randomly generated individuals. From there on, the genetic operations operate to improve the population.

The present invention uses a genetic algorithm to generate power-of-two coefficients for a one dimensional stable IIR filter. An IIR filter is a type of digital signal filter in which each sample of an output is the weighted sum of past and current samples of the input and past samples of the output. Thus, an IIR Filter produces an output, y(n), that is the weighted sum of the current and past inputs, x(n), and past outputs.

The output of a general IIR filter is given by:

$$y_n = \sum_{i=1}^{p} a_i y_{n-i} + \sum_{j=0}^{q} b_j x_{n-j},$$

where p is a non-zero value. Common types of IIR filters are Butterworth, Bessel, Chebyshev, and Elliptic.

The filter design is based on using the genetic algorithm to obtain the power-of-two coefficients such that the square error of their frequency responses is minimized. As a result, the designed filter, whose frequency response is closely matched to the frequency response of the desired filter, can be implemented using simple shifting operations without multipliers.

A desired IIR filter may be given as:

$$y(n)+a_1y(n-1)+\ldots+a_My(n-M)=b_0x(n)+b_1x(n-1)+\ldots+b_Nx(n-N).$$

A genetic algorithm is employed to find the coefficients of the designed multiplierless filter which may be given as:

$$y(n)+A_1y(n-1)+\ldots+A_Py(n-P)=B_0x(n)+B_1x(n-1)+\ldots+B_Qx(n-Q).$$

A genetic algorithm minimizes the cost function (squared error), $$E = \sum (h(n) - h_{designed}(n))^2,$$

for all n in a region of support of h(n) where h(n) is the impulse response of the desired filter and $h_{designed}(n)$ is an impulse response of the designed multiplierless filter. The order of the multiplierless filter, P, can be greater than or equal to the order of the desired filter, M.

The genetic algorithm defines a chromosome or an array of parameter values to be optimized. In the present invention, the parameter values are all filter coefficients $\{A_1, \ldots, A_p, B_0, B_1, \ldots, B_Q\}$. An integer genetic algorithm is employed to obtain the result.

The chromosome elements are represented by an integer which represents the power-of-two coefficient. By way of example, the set, $S\{n\}=\{\pm 2^{-8}, \pm 2^{-7}, \ldots \pm 2^{-1}, \pm 1\}$, represents a set of 17 integers accounting for the sign. One way to code the power-of-two coefficients is $\{-2^{-8}, -2^{-7}, \ldots, -2^{-1}, -1, 0, 1, \ldots, 2^{-8}\}=\{0, 1, \ldots, 7, 8, 9, \ldots, 15, 16\}$. Each chromosome is associated with a cost value found by evaluating the cost function. $N_{pop}$ is the total number of chromosomes and the genetic algorithm performs the following steps.

In an initial step, the genetic algorithm provides an initial population by generating $2N_{pop}$ chromosomes randomly. The genetic algorithm ranks the costs defined in the cost function from lowest cost to highest cost. The best $N_{pop}$ chromosomes are kept for each iteration, while the others are discarded.

In a second step, the genetic algorithm selects and pairs $N_{pop}$ chromosomes. Using a weighted random pairing scheme based on the cost of each chromosome, two chromosomes are randomly selected to produce two new chromosomes called offsprings. Pairing continues until new offsprings are generated to replace the discarded offspring. The population size $N_{pop}$ is constant for all iterations.

In a third step, the genetic algorithm generates two new offspring from each pair of chromosomes in the second step by crossover operation with a probability $P_c$. The paired chromosome exchanges a part of themselves at the crossover point, which is randomly selected between the first and last bits of the paired chromosomes.

In a fourth step, the genetic algorithm keeps the best (lowest cost) chromosome and applies a mutation function to the rest of the population with probability $P_m$. The mutation function replaces a chromosome with a new integer in the same set $S\{n\}$ at the mutation point which is also randomly selected.

The foregoing steps are repeated until the minimum solution meets the target value or the genetic algorithm does not yield better results after a certain number of iterations.

Referring to FIG. 1, a block diagram is shown of an architecture for an IIRfilter 10. The filter 10 includes a memory 12, such as a ROM ora variation thereof, that contains the power-of-two coefficients $\{a_1, \ldots a_M, b_0, \ldots b_N\}$ generated by a genetic algorithm. The present invention increases filter speed by limiting the design coefficients' to a power-of-two. Since the filter design is multiplierless, it is implemented with very small number of shifts and no multiplications. This allows for a very high throughput, consumes low power, since it has low gate count, and saves on chip area.

In one implementation, the memory 12 is a collection of single port ROMs for storing coefficients that are 9 bits wide. The number of words stored in the memory depends on the filter design constraints and the memory 12 may be configured to store any number of coefficients. By way of example, the memory 12 may be embodied as 32 independent ROMs, each of which is 8-words deep. The memory 12 may also be embodied in numerous other implementations based on application needs.

The filter 10 further includes a first shift register 18 that receives and stores input samples x(n). In one common-implementation, the first shift register 18 may be embodied as a 64-word deep, 9 bit wide shift register. When a new input sample x(n) is received, it is stored as the current sample and all previous samples are shifted by one storage location with the oldest sample discarded. As such, the first shift register 18 stores 64 input samples.

The filter 10 includes a second shift register 20 that receives previous outputs y(n−1). The second shift register 20 may be embodied as a 192-word deep, 9 bit wide shift register. When a new output y(n) is created, it is stored in the second shift register 20 as the current output and all previous outputs are shifted by one storage location with the oldest output discarded. As such, the second shift register store 192 previous outputs.

As can be appreciated by one of skill in the art, the shift registers 18, 20 may be configured in various ways and still be within the scope of the present invention. In one embodiment, 64 input samples x(n) to x(n−63) and 192 previous outputs y(n−1) to y(n−192) are stored in the shift registers 18, 20 to accommodate conventional practice for ghost cancellation for HDTV. The present invention is applicable for filtering techniques requiring various numbers of input samples and previous outputs. Thus, references to specific examples are for illustrative purposes only and should not be considered limiting of the scope of the invention.

The first shift register 18 is in communication with a first multiplexer 22 to combine the input samples x(n). In one implementation, the first multiplexer 22 is embodied as 8 8-input multiplexers. The second shift register 20 is in communication with a second multiplexer 24 to combine the previous outputs y(n−1). In one implementation, the second multiplexer 24 is embodied as 24 8-input multiplexers.

The shift registers 18, 20 are both in communication with a shifter stage 26 via multiplexers 22, 24. The memory 12 is also in communication with the shifter stage 26. The shifter stage 26 receives the power-of-two coefficients from the memory 12, the input samples x(n) from the first multiplexer 22, and the previous outputs y(n−1) from the second multiplexer 24. The shifter stage 26 performs a shift operation to provide products. The shifter stage 26 shifts the input samples x(n) and previous outputs y(n−1) by the corresponding power-of-two coefficients $\{A_1 \ldots A_M, B_0, \ldots B_N\}$.

The memory 12, shift registers 18, 20, and the multiplexers 22, 24 are in communication with a controller 28 that controls their respective operation. The controller 28 addresses a zero memory location and all other locations in the memory 12 and the shift registers 18, 20 via the multiplexers 22, 24. Thus, when the controller 28 places the address zero, the first coefficient and the corresponding input sample are transmitted to the shifter stage 26. In the next clock cycle, the shifter stage 26 provides the product of the first coefficient and the corresponding input sample.

The shifter stage 26 provides all products to an adder stage 30 which sums the products. The adder stage 30 is in communication with an accumulator 32 that accumulates the products provided by the adder stage 30 and produces an output estimate, y(n). After providing y(n) the accumulator 32 resets itself to zero to start accumulating for the new estimate. The resulting output y(n) is then transmitted to the shift register 20 for subsequent operations.

Figure 2:
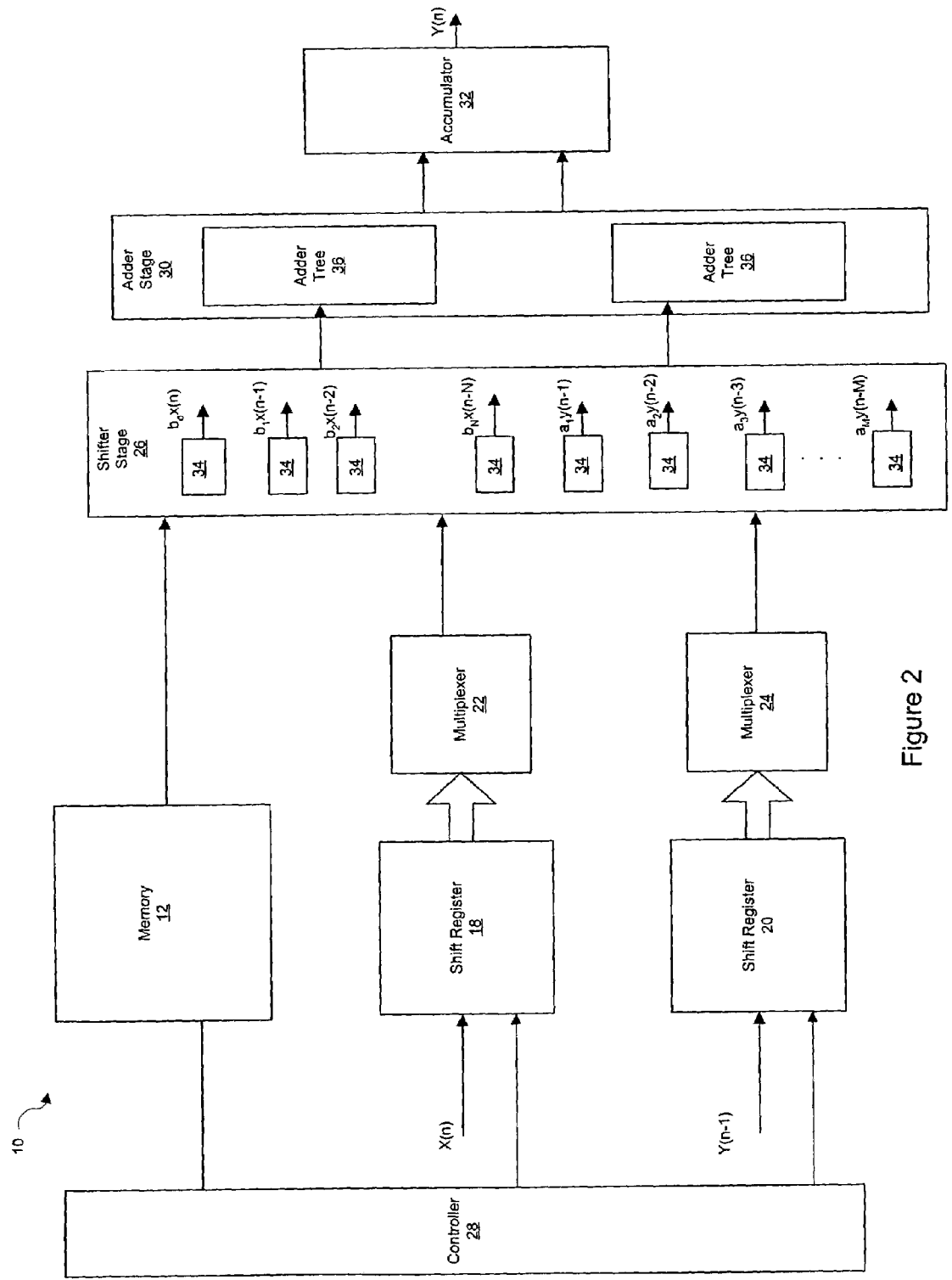
FIG. 2 is a block diagram of a filter design architecture.

Referring to FIG. 2, a block diagram of an IIR filter design 10 is shown in greater detail. The shifter stage 26 includes barrel shifters 34 that are disposed in parallel. Each barrel shifter 34 receives a power-of-two coefficient and a corresponding input sample or previous output. Each barrel shifter then provides a product of the power-of-two coefficient and the corresponding input sample or previous output. The number of barrel shifters 34 may vary based on design constraints and application. An increased number of barrel shifters 34 increases speed but requires more chip space. In one implementation, 32 barrel shifters may be used to complete 256 products in 8 clock cycles.

The barrel shifters 34 provide outputted products to the adder stage 30 that includes one or more adder trees 36. In the illustrated example, the adder stage 30 includes two adder trees 36 disposed in parallel to sum the received products. As can be appreciated, more or fewer adder trees 36 may be used based on design constraints. Each adder tree 36 is in communication with an accumulator 32 which accumulates the output of the adder trees 36 and provides an estimate, y(n). In the illustrated architecture, the accumulator 32 will provide an output, y(n), after 8 clock cycles.

Figure 3:
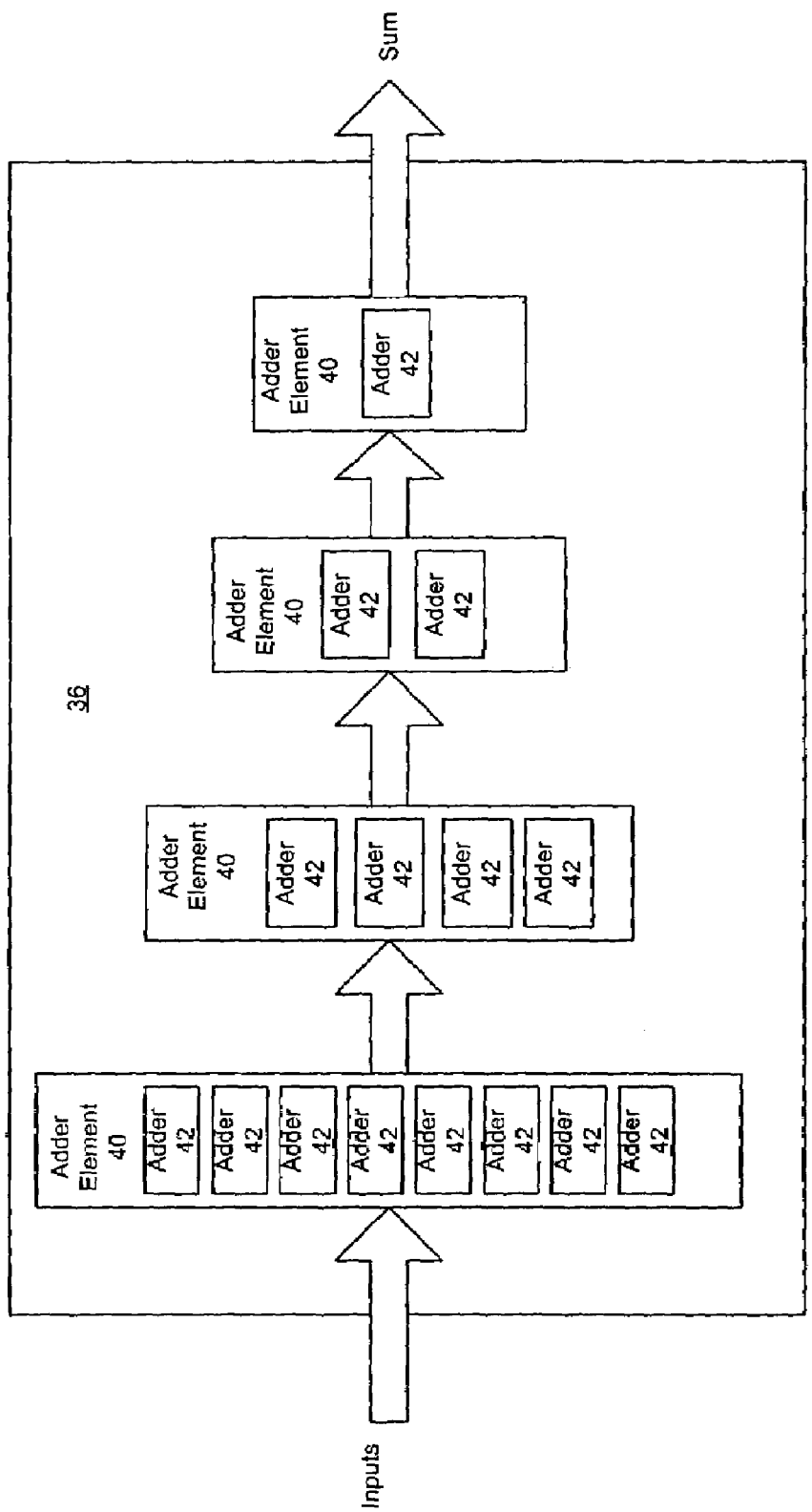
FIG. 3 is a block diagram of an adder tree structure.

Referring to FIG. 3, a block diagram of one embodiment of an adder tree structure 36 is shown. The adder tree 36 includes a series of adder elements 40 disposed in a series. Each adder element 40 includes a number of adders 42 disposed in parallel. In sequence, the adder elements 40 may include progressively fewer adders as the values are combined to a final sum. Furthermore, the adders 42 may sequentially progress in increased bit capacity as values increase.

In one example, an adder tree 36 receives 16 product inputs which are sent to a first adder element 40 having eight adders 42 to provide eight outputs. The 16 product inputs are generated by 16 corresponding barrel shifters. The adders 42 may be 17 bit to accommodate the inputs. The next adder element 40 has four adders 42, such as 18 bit adders, that receive eight inputs and provide four outputs. The subsequent adder element 40 has two adders 42, such as 19 bit adders, that receive four inputs and provide two outputs. A final adder element 40 has one adder 42, such as a 20 bit adder, that receives two inputs and provides a final sum.

In this example, the adder tree 36 initially takes 4 clock cycles to produce a sum of 16 inputs, but since the adder tree 36 is in a pipeline configuration the adder tree 36 produces a sum of 16 inputs every clock cycle afterwards. The illustrated adder tree structure 36 is for exemplary purposes only and numerous variations may be made in the adder elements 40 and the adders 42 themselves without departing from the scope of the invention.

The IIR filter design of the present invention provides a smaller, faster, and cheaper digital filter than conventional designs. The filter design provides a low gate count and increased speed by using power-of-two coefficients. The filter design incorporates parallelism and sequential pipelining to accommodate limited resources in circuit design and to operate at a faster clock. In operation, it is beneficial to receive an estimate, y(n), in 9 clock cycles. The present invention allows operation at a sampling time as fast as 9 times the clock period which is required for many applications.

It will be obvious to those having skill in the art that many changes may be made to the details of the above-described embodiments without departing from the underlying principles of the invention. The scope of the present invention should, therefore, be determined only by the following claims.

The invention claimed is:

1. A multiplierless IIR digital filter, comprising:
a memory having stored thereon power-of-two coefficients derived from a genetic algorithm;
a first shift register having an input to receive input samples;
a second shift register having an input to receive previous outputs;
a shifter stage in communication with the memory and the shift registers to receive the power-of-two coefficients, input samples, and previous outputs and perform a shift operation for corresponding power-of-two coefficients, input samples and previous outputs to thereby produce products; and
an adder stage, in communication with the shifter stage, to receive the products and provide a summation of the products.

2. The digital filter of claim 1, wherein the memory is a ROM.

3. The digital filter of claim 1, further comprising:
a first multiplexer in communication with the first shift register to receive the input samples; and
a second multiplexer in communication with the second shift register to receive the previous outputs.

4. The digital filter of claim 1, wherein the shifter stage includes barrel shifters with each barrel shifter performing a shift operation for a received power-of-two coefficient.

5. The digital filter of claim 4, wherein the shifter stage includes 32 barrel shifters.

6. The digital filter of claim 1, wherein the adder stage includes an adder tree having adder elements disposed in series.

7. The digital filter of claim, 6 wherein each adder element includes an adder for receiving two values and providing a sum.

8. The digital filter of claim 6, wherein the adder stage includes two adder trees disposed parallel to one another to receive products from the shifter stage, each adder tree having adder elements disposed in series and each adder element having an adder for receiving two values and providing a sum.

9. The digital filter of claim 1, further comprising an accumulator in communication with the adder stage to receive values from the adder stage and provide a sum of the values.

10. The digits filter of claim 1, further comprising a controller in communication with the memory and the shift registers.

11. A method for filtering an input signal through multiplierless digital techniques, the method comprising:
generating power-of-two coefficients from a genetic algorithm;
storing the power-of-two coefficients in a memory;
receiving input samples representative of the input signal and previous outputs, wherein receiving the input samples and previous outputs includes storing the input samples in a first shift register and storing the previous outputs in a second shift register;
performing a shift operation to generate products by applying the power-of-two coefficients in accordance with a filter design to corresponding input samples and previous outputs; and
adding the products in parallel to provide, sums of the products.

12. Method of claim 11, wherein receiving the input samples and previous outputs further includes receiving the input samples in a first multiplexer and receiving the previous outputs in a second multiplexer.

13. The method of claim 11, wherein the memory is a ROM.

14. The method of claim 11, wherein performing a shift operation includes barrel shifters shifting the input sample and previous outputs based on corresponding power-of-two coefficients.

15. The method of claim 11, wherein adding the products in parallel includes disposing adder elements in series, each adder element having an adder for receiving two values and providing a sum.

16. The method of claim 11, further comprising accumulating the sums of the products to provide an output.

17. A multiplierless IIR digital filter, comprising:
a memory having stored thereon power-of-two coefficients derived from a genetic algorithm;
a first shift register to receive input samples;
a second shift register to receive previous outputs;
a shifter stage in communication with the memory and the first and second shift registers, and including barrel registers to each perform a shift operation for corresponding power-of-two coefficients input samples, and previous outputs to thereby produce products;
an adder stage in communication With the shifter stage, and including adder trees, each adder tree having a series of adder elements to add the products in parallel and provide sums of the products; and
an accumulator in communication with the adder stage to add the sums of the products and produce an output.

18. The digital filter of claim 17, wherein the memory is a ROM.

19. The digital filter of claim 17, further comprising:
a first multiplexer in communication with the first register receive the input samples; and
a second multiplexer in communication with the second shift register to receive the previous outputs.

20. The digital filter of claim 17, wherein the shifter stage includes 32 barrel shifters.

21. The digital filter of claim 17, wherein the adder stage includes an adder tree having adder elements disposed in series.

22. The digital filter of claim 17, further comprising a controller in communication with the memory and the first and second shift registers.

23. A multiplierless IIR digital filter, comprising: memory means for storing thereon power-of-two coefficients derived from a genetic algorithm;
shift register means for receiving the input samples and previous outputs;
shifter means, in communication with the memory means and the shift register means, for performing a shift operation for corresponding power-of-two coefficients, input samples and previous outputs to thereby produce products; and adder means, in communication with the shifter stage for receiving the products and providing a summation of the products.

24. The digital filter of claim 23, wherein the memory means includes a ROM.

25. The digital filter of claim 23 wherein the shift register means includes a first shift register for receiving the inputs samples and a second shift register means for receiving the previous outputs.

26. The digital filter of claim 25, further comprising:
a first multiplexer means in communication with the first shift register means to receive the input samples; and
a second multiplexer means in communication with the second shift register means to receive the previous outputs.

27. The digital filter of clam 23, wherein the shifter means includes barrel shifters with each barrel shifter performing a shift operation for a received power-of-two coefficient.

28. The digital filter of claim 23 wherein the adder means includes an adder tree having adder elements disposed in series.

29. The digital filter of claim 28, wherein each adder element includes an adder for receiving two values and providing sum.

30. The digital filter of claim 28, wherein the adder means includes two adder trees disposed parallel to one another to receive products from the shifter means, each adder tree having adder elements disposed in series and each adder element having an adder for receiving two values and providing a sum.

31. The digital filter of claim 23, further comprising accumulator means, in communication with the adder means, to receive values from the adder means and provide a sum of the values.

32. The filter of claim 23, further comprising controller means in communication with the memory means and the shift register means.

* * * * *

UNITED STATES PATENT AND TRADEMARK OFFICE
CERTIFICATE OF CORRECTION

PATENT NO. : 7,289,558 B2
APPLICATION NO. : 10/615004
DATED : October 30, 2007
INVENTOR(S) : Bose et al.

It is certified that error appears in the above-identified patent and that said Letters Patent is hereby corrected as shown below:

Column 1, Line 36 reads, ". . . consumer electronic industry is . . ." which should read --. . . consumer electronics industry is . . .--

Column 3, Line 31 reads, ". . . example, would be multidimensional . . ." which should read --. . . example would be multidimensional . . .--

Column 3, Line 52 reads, ". . . an IIR Filter produces . . ." which should read --. . . an IIR filter produces . . .--

Column 5, Line 2 reads, ". . . for an IIRfilter 10. Thefilter 10 . . ." which should read --. . . for an IIR filter 10. The filter 10 . . .--

Column 5, Line 3 reads, ". . . a ROM ora variation . . ." which should read --. . . a ROM or a variation . . .--

Column 5, Lines 60-61 reads, ". . . the second mutliplexer 24. The . . ." which should read --. . . the second multiplexer 24. The . . .--

Column 5, Line 64 reads, ". . . coefficients $\{A_1...A_M, B_0,...B_n\}$." which should read --. . . coefficients $\{A_1,...A_m, B_0, ....B_n\}$.--

Column 7, Line 48 reads, ". . . digital filter of claim, 6 wherein . . ." which should read --. . . digital filter of claim 6, wherein . . .--

Column 7, Line 61 reads, "10. The digits filter of claim . . ." which should read --10. The digital filter of claim . . .--

Column 8, Line 11 reads, ". . . in parallel to provide, sums of . . ." which should read --. . . in parallel to provide sums of . . .--

Column 8, Line 39 reads, ". . . stage in communication With the . . ." which should read --. . . stage in communication with the . . .--

UNITED STATES PATENT AND TRADEMARK OFFICE
CERTIFICATE OF CORRECTION

PATENT NO. : 7,289,558 B2
APPLICATION NO. : 10/615004
DATED : October 30, 2007
INVENTOR(S) : Bose et al.

It is certified that error appears in the above-identified patent and that said Letters Patent is hereby corrected as shown below:

Column 9, Line 19 reads, ". . . digital filter of claim 23, wherein . . ." which should read --. . . digital filter of claim 23, wherein . . .--

Column 10, Line 17 reads, "32. The filter of claim 23, . . ." which should read --32. The digital filter of claim 23, . . .--

Signed and Sealed this

Fifth Day of August, 2008

JON W. DUDAS
*Director of the United States Patent and Trademark Office*